United States Patent [19]

Kanada et al.

[11] 4,361,639
[45] Nov. 30, 1982

[54] METHOD FOR TREATING LITHOGRAPHIC PRINTING PLATES

[75] Inventors: Eiji Kanada; Toshiro Kondo; Shoji Yamada, all of Nagaokakyo, Japan

[73] Assignee: Mitsubishi Paper Mills, Ltd., Tokyo, Japan

[21] Appl. No.: 285,321

[22] Filed: Jul. 22, 1981

[30] Foreign Application Priority Data

Jul. 29, 1980 [JP] Japan .................................. 55-104176

[51] Int. Cl.$^3$ ........................... G03C 7/02; G03C 5/54
[52] U.S. Cl. .................................... 430/204; 430/302; 430/309; 430/331
[58] Field of Search ................. 430/302, 309, 331, 204

[56] References Cited

U.S. PATENT DOCUMENTS 3,547,641  12/1970  Blake .................................... 430/302
3,592,647  7/1971   Blake .................................... 430/302
3,736,871  6/1973   Blake .................................... 430/302
4,297,429  10/1981  Kanada et al. ...................... 430/204
4,297,430  10/1981  Kanada et al. ...................... 430/302

Primary Examiner—Won H. Louie, Jr.
Attorney, Agent, or Firm—Cushman, Darby & Cushman

[57] ABSTRACT

Surface treatment of lithographic printing plate which utilizes as ink receptive areas a photographically formed image silver per se or image silver halide per se is carried out in the presence of an organic compound having at least one mercapto or thione group and at least one hydrophilic group in the same molecule and an inorganic water-insoluble fine powder having a particle size of $0.1\mu$ or less after imagewise exposure of a silver halide emulsion layer and processing thereof to develop an image, whereby ink receptivity, anti-staining property and printing endurance of the plate can be improved.

10 Claims, No Drawings

METHOD FOR TREATING LITHOGRAPHIC PRINTING PLATES

This invention relates to a method for treating lithographic printing plates, particularly those in which the imaged silver per se or the imaged silver halide per se produced by photographic processes is used as ink-receptive area.

The lithographic printing place consists of oleophilic image areas receptive to a greasy ink and oil-repellent non-image areas not receptive to the ink. The non-image areas generally consist of a hydrophilic surface receptive to water. Accordingly, common lithographic printing is performed by supplying both the ink and water to the printing plate, whereby the image areas and the non-image areas selectively accept the chromatic ink and water, respectively, and then transferring the ink in the image areas to a substrate such as, for example, paper. It is necessary for high-quality printing, therefore, that there be a sufficient contrast in the surface characteristics between the oleophilic image areas and the hydrophilic non-image areas so that when an ink and water are supplied to the printing plate surface, the image areas may accept a sufficient quantity of the ink, while the non-image areas may completely repel the ink. It is important also from the commercial viewpoint that the said characteristics may be steadily retained for a long period of time after the plate making.

There have heretofore been known various materials for lithographic printing, methods of production thereof and methods of making printing plates therefrom. For instance, there are printing plates comprising diazo sensitized organic colloids supported on metallic plates such as aluminum (PS plates), printing plates utilizing electrophotography, and printing plates involving silver salt photographic processes. Such printing plates are now in actual use in combination with recently developed processing and printing techniques using, for example, etch solution, dampening solution, and so on depending on the kinds of materials of the plates. Photographic materials comprising silver halide emulsions, which have a high sensitivity and can be spectrally sensitized, are suitable for the automated production of printing plates and are already in actual use in several forms.

Typical methods for making printing plates by utilizing photosensitive silver halide emulsions include the following:

(1) A method which involves tanning development of a hydrophilic gelatino silver halide emulsion to harden the gelatin in the developed areas, thus making it oleophilic and receptive to a greasy printing ink (U.S. Pat. No. 3,146,104).

(2) A printing plate which utilizes the silver diffusion transfer process to make the metallic silver pattern on the surface oleophilic which is made ink receptive [U.S. Pat. Nos. 3,721,559 and 3,490,905; Japanese Pat. Post-examined Publication (Kokoku) No. 30,562/73; A. Rott and L. Dehaes, Journal of Photographic Science, 8, 26-32 (1960)].

(3) A method for making a lithographic printing plate by utilizing the etching bleach process, which comprises treating the silver image areas formed on development or transfer development with a bleach solution, whereby the gelatin in the silver pattern area is destroyed at the same time to expose the oleophilic layer (U.S. Pat. Nos. 3,385,701 and 3,814,603; Japanese Pat. Post-examined Publication (Kokoku) No. 27,242/69).

(4) A method in which undeveloped silver halide image areas in the developer-treated hydrophilic gelatino silver halide emulsion layer are selectively made oleophilic and thus ink receptive [U.S. Pat. Nos. 3,454,398, 3,764,323 and 3,099,209; Japanese Pat. Pre-examined Publication (Kokai) No. 9,603/78].

In the method (1) the hardened gelatin layer on the surface of printing plate is used as ink receptive areas, whereas in the methods (2) and (4) generally the silver or silver halide per se on the surface of lithographic printing plate is utilized as ink receptive areas (in most cases said silver or silver halide is treated in some way or other such as, for example, with a mercapto compound as disclosed in Japanese Pat. Post-examined publications (Kokoku) No. 29,723/73 and 486/76 to enhance or impart oleophilicity, that is, ink receptivity).

There is, however, a persistent demand for further improvement in printing characteristics such as ink receptivity, anti-staining property, and printing endurance of any lithographic printing plate, not excepting the above-said one which utilizes as ink receptive areas the image silver or silver halide per se formed by photographic processes.

An object of this invention is to improve printing characteristics, particularly ink receptivity, anti-staining property, and printing endurance of a lithographic printing plate which utilizes imaged silver per se or imaged silver halide per se as ink receptive areas.

Another object of this invention is to provide compositons, particularly an etch solution and a dampening solution for treating the surface of a lithographic printing plate which utilizes imaged silver per se or imaged silver halide per se as ink receptive areas.

Other objects and features of this invention will become apparent from the following description.

In the course of studies on the printing plate which utlizes as ink receptive areas the transferred silver formed by the silver complex diffusion transfer process, disclosed fundamentally in Japanese Pat. Post-examined Publications (Kokoku) No. 16,725/73 and 30,562/73, the present inventors found that when an organic compound having a specific structure and a finely powdered water-insoluble inorganic substance are present under acidic conditions, said printing plate is markedly improved in ink receptivity, resistance against the ink staining, and printing endurance without any decline in oleophilicity of the image areas.

The above-mentioned organic compound with a specific structure is an organic compound having in its molecule at least one mercapto or thione group and at least one hydrohilic group such as carboxyl group, sulfo group, or the like. The finely powdered water-insoluble inorganic substance is a finely powdered water-insoluble inorganic substance having a particle sizes of $0.1\mu$ or below, preferably a colloidal silica of said particle size.

The hydrophilic groups of the organic compound with a specific structure include carboxyl, sulfo, hydroxyl and carbonyl groups. Of these groups, preferred are carbonyl, hydroxyl and carboxyl groups. Since the organic compound and the inorganic fine powder are used, according to this invention, in a solution for treating the printing plate surface such as an etch solution or a dampening solution, it is desirable that the organic compound be soluble in an aqueous solution of pH 7 or below, the solubility at 20° C. being $10^{-4}$ g or more, preferably $5 \times 10^{-3}$ g or more per liter of the aqueous solution at a pH of 7 or below. Such organic compounds have been known to be a powerful hydrophilizing agent and a major component of a correcting solution for the silver image of an offset printing plate (cf. Japanese Pat. Post-examined Publication (Kokoku) No. 15,761/76). However, if such an organic compound is used alone in solutions for use in making a printing plate, such as developer solution, neutralizing solution and fixing solution or in solutions for treating the printing plate surface, such as etch solution and dampening solution, there will result marked decline in oleophilicity or ink receptivity of the image areas, little improvement in resistance against the ink staining, and no improvement in printing characteristics of the lithographic printing plate utilizing the imaged silver per se or the imaged silver halide per se as ink receptive areas, the results being quite opposite to the object of this invention.

It is also known that the hydrophilicity of the non-image areas is improved by the addition of a water-insoluble inorganic fine powder to a processing solution in printing plate making, such as a neutralizing solution or fixing solution or to a surface treating solution in printing operation, such as an etch solution. If used alone, however, such an inorganic fine powder is unable to achieve sufficiently the object of this invention. Although it has been generally believed that an inorganic fine powder such as colloidal silica or colloidal alumina adsorbs to the surface of a lithographic printing plate and forms on the surface a hydrophilic layer which improves the hydrophilicity of the surface, yet the improvement is insufficient for the prevention of printing ink staining which is the most important of the items required to be improved in the lithographic printing.

The present inventors conducted experimental studies on the additives capable of promoting and making more perfect the adsorption of an inorganic fine powder such as colloidal silica or colloidal alumina on the surface of a lithographic printing plate. As a result it was found that the above-mentioned organic compound has an ability to meet the above requirement and is capable of improving the hydrophilicity of the printing plate surface to a level which is not attainable with either of the said organic compound or the inorganic fine powder alone. It was also found unexpectedly that the combined use of said organic compound and the inorganic fine powder results in suppression of the tendency of said organic compound to hydrophilize the image areas and a marked increase in the ability of the inorganic fine powder to hydrophilize the non-image area of the printing plate. It is surprising, moreover, that the joint use brings about remarkable improvement in printing characteristics, particularly ink receptivity, anti-staining ability, and printing endurance of the printing plate which utilizes the image silver per se or the image silver halide per se as ink receptive areas. Thus, the object of this invention is achieved.

The method of this invention is characterized in that after the imagewise exposure and development, the plate making treatment with, e.g., neutralizing solution, fixing solution, etc. or the plate surface treatment with, e.g., etch solution, dampening solution, etc. is carried out in the presence of the organic compound having a specific structure and the inorganic fine powder mentioned above.

The object of this invention is achieved in such way that after the imagewise exposure and development, the lithographic printing plate, which utlizes as ink receptive areas the image silver per se or the image silver halide per se formed by photographic processes, is treated with solutions, at least one of which contains the organic compound having a specific structure and the water-insoluble inorganic fine powder mentioned above, said solutions including processing solutions used in printing plate processing such as neutralizing solution and fixing solution and treating solutions used in treating the printing plate surface in printing operation such as etch solution and dampening solution, and said at least one of the solutions being preferably the etch solution.

Non-limitative examples of individual organic compounds having a structure conforming to that mentioned above include hydroxymercaptans such as 2-mercaptoethanol (1) and α-thioglycerol (2); mercaptoalkylcarboxylic acids such as thioglycolic acid (3), α-mercaptopropionic acid (4), β-mercaptopropionic acid (5), α-mercaptobutyric acid (6), β-mercaptobutyric acid (7), γ-mercaptobutyric acid (8), bis-(mercaptomethyl)-butyric acid (9), α-mercaptocaproic acid (10), cysteine (11) and thiomalic acid (12); mercaptoalkylsulfonic acids such as 2-mercapto-1-ethanesulfonic acid (13) and 3-mercapto-1-propanesulfonic acid (14); heterocyclic compounds and derivatives such as rhodanine (15), 2-mercaptobenzimidazole-5-sulfonic acid (16), 2-mercapto-5-benzothiazolesulfonic acid (17), 2-mercapto-5-benzoxazolesulfonic acid (18), 2-carboxymethylthio-5-mercapto-1,3,4-thiadiazole (19), 1-(3-carboxyphenyl)-5-mercaptotetrazole (20), thiohydantoin (21) and 2-mercaptohistidine (22); and 1-β-hydroxyethyl-3-aryl-2-thiourea (23). The salts of the above compounds are also effective likewise.

The above-mentioned water-insoluble fine powder is an inorganic fine powder having a particle size of $0.1\mu$ or below. Particularly preferred are oxides or hydroxides of the metals of Group III or IV of the periodic table and those in sol form, such as colloidal silica or colloidal alumina, having a particle size of from 0.001 to $0.05\mu$.

Although the organic compound and the fine powder can be used independently in different solutions and either of the two can be applied earlier, it is desirable to use both compounds in the same solution for treating the printing plate in printing operation, that is, etch solution or dampening solution, the latter being most preferred.

Non-limitative examples of lithographic printing plates suitable for use in the present method include the printing plates utilizing as ink receptive areas the silver per se of the positive type or negative type (photosensitive layer of direct positive silver halide emulsion) as disclosed in Japanese Pat. Post-examined Publications (Kokoku) No. 16,725/73, 29,446/76, 5,801/73 and 43,002/74, Japanese Patent Pre-examined Publications (Kokai) No. 111,103/76 and 139,401/76, U.S. Pat. Nos. 3,721,559 and 3,490,905, Japanese Pat. Pre-examined Publications (Kokai) No. 106,902/77, 112,402,77, 21,602/78, 21,601/78 and 56,501/78; and those in which the silver halide per se is used as ink receptive areas as described in U.S. Pat. Nos. 3,454,398, 3,764,323 and 3,099,209, Japanese Pat. Pre-examined Publication (Kokai) No. 46,002/72, 9,603/78 and 102,105/78. Other suitable lithographic printing plates include those which utilize as ink receptive areas the silver per se or the silver halide per se formed by the photographic processes such as silver complex diffusion transfer process, physical development process, chemical development process, or combinations thereof.

The surface layer of these printing plates (original plates) is a physical development nuclei-bearing layer or a silver halide emulsion layer and in such a layer is used generally one or more hydrophilic polymeric vehicles such as gelatins (including alkali-processed gelatin, acid-processed gelatin, grafted gelatin, acrylated gelatin and other modified gelatins), starch, albumin, sodium alginate, hydroxyethylcellulose, gum arabic, polyvinyl alcohol, polyvinylpyrrolidine, carboxymethylcellulose, polyacrylamide, acrylamidevinylimidazole copolymers, styrene-maleic anhydride copolymers, and polyvinyl methyl ether-maleic anhydride copolymers.

The physical development nuclei layer of the lithographic printing plate described fundamentally in Japanese patent Post-examined Publications (Kokoku) No. 16,725/73 and 30,562/73 contains no or only a small amount of such a polymeric vehicle, because the particles of physical development nuclei must protrude from the free surface. The method of this invention is effectively applicable especially to such a type of lithographic printing plate.

The photographic elements suitable for the method of this invention contain a photosensitive silver halide photographic emulsion layer and the lithographic printing plate made from such photographic elements utilizes silver per se or silver halide per se as ink receptive areas. The said silver halide photographic emulsion layer can be prepared by conventional processes well known to the art and some methods for improving the emulsion layer to become particularly suitable for making printing plate may be found in the literature for reference.

The photographic element used in the method of this invention is generally treated, after imagewise exposure, with an alkaline developer, then, if necessary, with neutralizing solution, fixing solution, etch solution, dampening solution and other treating solutions generally used in the printing plate processing and in the printing operation. The developer may be any of the common photographic alkaline developing solutions containing developing agents such as hydroquinone, developing solutions for silver diffusion transfer development containing a thiosulfate, and activated high-alkali developers. The contrast between the olephilicity of image areas and the hydrophilicity of non-image areas can be enhanced by the use of a developer containing an organic compound having a mercapto or thione group as substituent or a heterocyclic compound with sulfur as hetero atom, as disclosed in Japanese Pat. Post-examined Publication (Kokoku) No. 486/76 and Japanese Pat. Pre-examined Publication (Kokai) No. 150,105/77, said compounds being capable of improving the ink receptivity of image areas.

The compositions of neutralizing solution, fixing solution, etch solution, and dampening solution suitable for the purpose of use and the type of printing plate material are well known to those skilled in the art. It is desirable to modify the activity of these treating solutions by adding conventionally known additives such as etching accelerators, buffers, preservatives and wetting agents. Examples of such additives include gum arabic, carboxymethylcellulose, sodium alginate, polyvinylpyrrolidone, polyvinylimidazole, copolymers of methyl vinyl ether and maleic anhydride, carboxymethylstarch, ammonium alginate, alginic acid, oxidized cellulose, methylcellulose, sulfates (sodium sulfate, ammonium sulfate, etc.); phosphoric acid, nitric acid, nitrous acid, tannic acid, and salts thereof; polyol compounds having two or more hydoxyl groups (polyethylene glycol, ethylene glycol, propylene glycol, glycerol, diethylene glycol, hexylene glycol, etc.), organic weak acids (citric acid, succinic acid, tartaric acid, adipic acid, ascorbic acid, propionic acid, etc.), polyacrylic acid, ammonium dichromate, chrome alum, propylene glycol alginate, salts of aminopolycarboxylic acids (e.g. sodium ethylenediaminetetraacetate), and surface active agents. By the addition of one or more of these additives, there will be obtained more suitable treating solutions for use in printing plate making and in printing operation to achieve the object of this invention. In addition to the above-listed additives, water-miscible organic solvents such as methanol, dimethylformamide and dioxane may be added. It is not objectionable to add very small amounts of coloring substances such as phthalocyanine dyes, malachite green and ultramarine taking especially into consideration the discrimination and appearance of the solutions.

This invention covers the printing plate processing and treatment of the printing plate in printing operation by use of the above solutions, at least one of which contains the organic compound and the fine powder as herein specified. Although the amounts to be added of the organic compound and the fine powder depend upon the type and composition of the solution and the type of printing plate material, the organic compound and the fine powder are used each in an amount of approximately $10^{-4}$ to 10 g, preferably $5 \times 10^{-3}$ to 10 g per liter of the solution. This is only a rough criterion and, if necessary, they can be used each in an amount falling outside the above range. The optimal amount of each substance should be selected so as to keep balance with the quantity of hydrophilic polymeric vehicle in the printing plate and the quantity of ink receptive substance in the solution.

The invention is illustrated below with reference to Examples.

EXAMPLE 1

On one side of a coated paper sheet, 135 g/m$^2$, which had been coated on both sides with polyethylene, was provided a matting layer containing silica particles of 5μ in particle size. On the other side, which had been treated with corona discharge, was provided an antihalation layer containing carbon black. The antihalation layer was overcoated with 1.0 g/m$^2$ (in terms of silver nitrate) of an orthochromatically sensitized high-contrast silver chlorobromide emulsion containing silica particles of 5μ in average particle size. The antihalation and emulsion layers contained formaldehyde as hardener. After drying, the photosensitive element thus obtained was kept at 40° C. for 3 days. The emulsion layer of the element was then overcoated at a rate of 5 m/minute with a palladium sulfide sol prepared in the following way:

Preparation of palladium sulfide sol:

| Solution A: | |
|---|---|
| PdCl$_2$ | 5 g |
| Hcl | 40 ml |
| Water | 1 liter |
| Solution B: | |
| Na$_2$S | 8.6 g |
| Water | 1 liter |

Solutions A and B were mixed with stirring. After 30 minutes, the mixture was purified by passing through a column packed with ion exchange resins for purifying water and mixed with Solution C to obtain a coating composition.

| Solution C: | |
|---|---|
| Methyl vinyl ether-maleic anhydride copolymer (1.25%) | 100 ml |
| 10% Aqueous saponin solution | 200 ml |
| Water | 18,000 ml |

The photographic element for printing plate thus obtained was exposed imagewise in a letterpress camera provided with image reversal mechanism and developed with the following silver complex diffusion transfer developer at 30° C. for 60 seconds:

| Transfer developer: | |
|---|---|
| Water | 1,500 ml |
| Sodium hydroxide | 20 g |
| Anhydrous sodium sulfite | 100 g |
| Hydroquinone | 16 g |
| 1-Phenyl-3-pyrazolidone | 1 g |
| Sodium thiosulfate | 16 g |
| Potassium bromide | 3 g |
| 1-Ethyl-2-mercapto-benzimidazole | 0.05 g |
| 3-Mercapto-4-acetamido-5-n-heptyl-1,2,4-triazole | 0.1 g |
| Water to make up to | 2 liters |

After development, the photographic element was passed between two squeeze rolls to remove the excess developer, then treated with a neutralizing solution of the following composition, and dried under ambient temperature and humidity conditions.

| Neutralizing solution: | |
|---|---|
| Water | 600 ml |
| Ethylene glycol | 5 g |
| Citric acid | 10 g |
| Sodium citrate | 35 g |
| Water to make up to | 1 liter |

The lithographic printing plate thus prepared was mounted on an offset press, then rubbed all over the printing plate surface with the following etch solution, and printing was performed using the following dampening solution:

| Etch solution: | |
|---|---|
| Water | 600 ml |
| Isopropyl alcohol | 400 ml |
| Ethylene glycol | 50 g |
| 3-Mercapto-4-acetamide-5-n-heptyl-1,2,4-triazole | 1 g |

| Dampening solution (before using, diluted tenfold with water): | |
|---|---|
| Water | 880 ml |
| Succinic acid | 6 g |
| Boric acid | 8.4 g |
| Sodium sulfate | 2.5 g |
| Cobalt chloride | 2.5 g |
| Ethylene glycol | 100 g |

The above procedure was repeated, except that the organic compound exemplified previously and the inorganic fine powder (colloidal silica) were added to the neutralizing solution each in an amount of 0.5 g per liter. In comparative experiments, either 0.5 g of the organic compound or 0.5 g of the inorganic fine powder (colloidal silica) was added per liter of the neutralizing solution.

The printing press used was A. B. Dick 350 CD (trademark for an offset press supplied by A. B. Dick Co.). The ink receptivity, ink staining, and printing endurance were evaluated in the following manner.

(1) Ink receptivity: Using F Gloss Sumi (tradename for a printing ink), feeding of paper sheets was started as soon as the inking roll was brought into contact with the surface of printing plate. The ink receptivity was evaluated by counting the number of impressions required before a copy in good image density was obtained.

(2) Ink stain: A printed copy obtained after 1,000 impressions using F Gloss Konai (tradename for a printing ink) had been made was evaluated for the degree of stain and expressed in the following way:
  ○ No stain at all
  Δ Partial stain or light stain
  × Heavy stain all over the printed copy (3) Printing endurance: Printing was further continued after 1,000 copies had been obtained and the number of copies was counted until stain was detected. The results of evaluation were expressed in the following way:
  ○ 2,000 copies or more
  Δ 1,000 to 2,000 copies
  × Less than 1,000 copies Sample Nos. 17-19 were obtained when either of the organic compound or the inorganic fine powder was added in an amount of 1 g per liter of the solution.

TABLE 1

| Sample No. | Compound No. | Fine powder | Ink receptivity | Stain | Endurance |
|---|---|---|---|---|---|
| 1 | — | — | 30 | × | Δ |
| 2 | — | Present | 30 | Δ | ○ |
| 3 | (2) | — | 80 | Δ | Δ |
| 4 | (2) | Present | 15 | ○ | ○ |
| 5 | (4) | — | 100 | Δ | Δ |
| 6 | (4) | Present | 15 | ○ | ○ |
| 7 | (12) | — | 50 | Δ | Δ |
| 8 | (12) | Present | 15 | ○ | ○ |
| 9 | (14) | — | 100 | Δ | Δ |
| 10 | (14) | Present | 15 | ○ | ○ |
| 11 | (16) | — | 70 | Δ | Δ |
| 12 | (16) | Present | 15 | ○ | ○ |
| 13 | (18) | — | 70 | Δ | Δ |
| 14 | (18) | Present | 15 | ○ | ○ |
| 15 | (23) | — | 60 | Δ | Δ |
| 16 | (23) | Present | 15 | ○ | ○ |
| 17 | — | Present | 30 | Δ | ○ |
| 18 | (2) | — | 80 | Δ | Δ |
| 19 | (4) | — | 100 | Δ | Δ |

EXAMPLE 2

Experiments were carried out by following the procedure of Example 1, except that each 5 g of the organic compound (previously described as examples) and the inorganic fine powder was added to the same dampening solution (stock solution) as used in Example 1. In comparative experiments, either 5 g of the organic compound or 5 g of the inorganic fine powder was added. The lithographic printing plate was sample No. 1 of Example 1.

TABLE 2

| Dampening solution | Compound No. | Fine powder | Ink receptivity | Stain | Endurance |
|---|---|---|---|---|---|
| a | — | — | 30 | X | X |
| b | — | Present | 30 | Δ | Δ |
| c | (1) | — | 70 | Δ | Δ |
| d | (1) | Present | 15 | ◯ | ◯ |
| e | (3) | — | 60 | Δ | Δ |
| f | (3) | Present | 15 | ◯ | ◯ |
| g | (13) | — | 70 | Δ | Δ |
| h | (13) | Present | 15 | ◯ | ◯ |
| i | (17) | — | 70 | Δ | Δ |
| j | (17) | Present | 15 | ◯ | ◯ |
| k | (22) | — | 80 | Δ | Δ |
| l | (22) | Present | 15 | ◯ | ◯ |

EXAMPLE 3

Example 2 was repeated, except that each 2 g of the organic compound (exemplified before) and the inorganic fine powder was added to the etch solution of Example 1 in place of the dampening solution. It was found that the ink receptivity, anti-staining property and printing endurance were improved as in Example 2.

What is claimed is:

1. In a method for treating a lithographic printing plate which utilizes as ink receptive areas a photographically formed silver image or silver halide image wherein after imagewise/exposure of a silver halide emulsion layer and processing thereof to develop an image, the printing plate surface treatment is carried out at pH7 or below in the presence of an organic compound having at least one mecapto or thione group and at least one hydrophillic group in the same molecule and an inorganic water-insoluble colloidal silica or colloidal alumina powder having a particle size of 0.1 micron or below which are present in at least one printing plate treating solution selected from neutralizing solution, etch solution and dampening solution, said powder being present in an amount sufficient to prevent the ink-staining of said lithographic printing plate, said organic compound being present in an amount sufficient to promote effective absorption of said powder on said lithographic printing plate.

2. A method according to claim 1 wherein said organic compound and fine powder are contained in the same printing plate treating solution.

3. A method according to claim 2, wherein both the organic compound and the fine powder are present in the dampening solution.

4. A method according to claim 1, wherein the hydrophilic group of the organic compound is selected from the carboxyl group, sulfo group, hydroxyl group and carbonyl group.

5. A method according to claim 4, wherein the hydrophilic group is selected from the carboxyl group, hydroxyl group, and carbonyl group.

6. A method according to claim 1, wherein the organic compound has a solubility of $10^{-4}$ g/liter or above at 20° C. in an aqueous solution of pH 7 or below.

7. A method according to claim 1 or 6, wherein the organic compound is selected from the mercaptoalkylcarboxylic acids, mercaptoalkylsulfonic acids, heterocyclic compounds and thiourea derivatives.

8. A method according to claim 1, wherein use is made of an aqueous solution for treating the printing plate surface, which contains the organic compound in the range of from $10^{-4}$ to 10 g/liter.

9. A method according to claim 1, wherein the fine powder is present in the range of from $10^{-4}$ to 10 g/liter.

10. A method according to claim 1, wherein use is made of a lithographic printing plate which utilizes as ink receptive areas the transferred silver per se formed by the silver complex diffusion transfer process.

* * * * *